United States Patent
Lee et al.

(10) Patent No.: US 7,898,164 B2
(45) Date of Patent: Mar. 1, 2011

(54) ORGANIC LIGHT EMITTING DEVICE COMPRISING MICROCAVITY PORTIONS CONTAINING FILMS WITH DIFFERENT OPTICAL LENGTHS

(75) Inventors: Chung-Chun Lee, Hsinchu (TW); Hsing-Chuan Li, Hsinchu (TW)

(73) Assignee: Au Optronics Corp., Hsinchu (TW)

( * ) Notice: Subject to any disclaimer, the term of this patent is extended or adjusted under 35 U.S.C. 154(b) by 744 days.

(21) Appl. No.: 11/829,197

(22) Filed: Jul. 27, 2007

(65) Prior Publication Data

US 2008/0191612 A1    Aug. 14, 2008

(30) Foreign Application Priority Data

Feb. 9, 2007    (TW) ............................... 96104764 A

(51) Int. Cl.
*H01J 1/62* (2006.01)
*H01J 63/04* (2006.01)

(52) U.S. Cl. ....................... 313/498; 313/509
(58) Field of Classification Search ........................ None
See application file for complete search history.

(56) References Cited

U.S. PATENT DOCUMENTS

| | | | |
|---|---|---|---|
| 5,554,911 A * | 9/1996 | Nakayama et al. | 313/504 |
| 2005/0057136 A1 | 3/2005 | Moriya et al. | |
| 2005/0280364 A1 | 12/2005 | Omura | |
| 2006/0192220 A1 | 8/2006 | Nishikawa | |

FOREIGN PATENT DOCUMENTS

| | | |
|---|---|---|
| CN | 1717135 | 1/2006 |
| CN | 1832195 | 9/2006 |

OTHER PUBLICATIONS

"Advanced Organic Light-Emitting Devices for Enhancing Display Performances" Journal of Display Technology, vol. 01, No. 2, Dec. 2005; Chung-Chih Wu, Chieh-Wei Chen, Chun-Liang Lin, and Chih-Jen Yang.*
English Abstract of CN 1717135.
English Abstract of CN 1832195.

* cited by examiner

*Primary Examiner*—Toan Ton
*Assistant Examiner*—Britt D Hanley
(74) *Attorney, Agent, or Firm*—Thomas, Kayden

(57) ABSTRACT

A self-emissive display device. The display device comprises a substrate having a pixel region for displaying one of the primary colors. An organic electroluminescent multi-layer structure is disposed in the pixel region of the substrate. The organic electroluminescent multi-layer structure comprises a first micro-cavity portion and a second micro-cavity portion adjacent thereto. The first micro-cavity portion comprises an organic layer for light-emitting and a first film for determining light wavelength shift of the first micro-cavity portion. The second micro-cavity portion comprises the organic layer for light-emitting and a second film for determining light wavelength shift of the second micro-cavity portion. The first and second films have different optical lengths, such that the first and second micro-cavity portions provide opposite directions of the light wavelength shift.

10 Claims, 4 Drawing Sheets

ORGANIC LIGHT EMITTING DEVICE COMPRISING MICROCAVITY PORTIONS CONTAINING FILMS WITH DIFFERENT OPTICAL LENGTHS

BACKGROUND OF THE INVENTION

1. Field of the Invention

The invention relates to a self-emissive display device and in particular to an organic light-emitting device (OLED) with a micro-cavity structure.

2. Description of the Related Art

Organic light-emitting diodes (OLEDs) are active lighting devices using organic materials. Compared with conventional inorganic LEDs, OLEDs can be easily fabricated on a large substrate by forming an amorphous silicon layer thereon. Additionally, displays utilizing OLEDs require no backlight module, such that the manufacturing process is simpler and relatively lower in costs. OLED technology is highly developed and can be employed in small panels such as those in personal digital assistants (PDAs) or digital cameras. As OLED technology matures, applications in larger panels such as personal computers, televisions and even flexible displays will be possible.

A typical OLED may comprise an anode, a cathode and an organic electroluminescent layer disposed between the anode and the cathode. The anode and the cathode are oppositely disposed on a substrate. The organic electroluminescent layer comprises a hole injection layer (HIL) and a hole transport layer (HTL) adjacent to the anode, an electron injection layer (EIL) and an electron transport layer (ETL) adjacent to the cathode 214, and an emitting material layer (EML) sandwiched between the HTL and the ETL. When an electrical potential difference is applied between the cathode and the anode, electrons are injected into the ETL from the cathode through the EIL, and then pass through the ETL and the EML. At the same time, holes are injected into the HTL from the anode through the HIL, and then pass therethrough. The injected electrons and holes are recombined at the interface of the EML and the HTL, releasing energy as light.

An organic electroluminescent layer may be placed within a micro-cavity structure to improve efficiency and color saturation of the OLED. In the micro-cavity structure, the emitting light may induce constructive and destructive interferences to enhance emission at a specific wavelength. However, the light intensity and wavelength may be varied when viewed at various angles, such that the view angle is reduced. In other words, in the OLED with a micro-cavity structure, the color of the emission may be changed (i.e. color shift) when viewed at various angles.

Thus, there exists a need for an improved OLED capable of increasing efficiency and color saturation while mitigating the color shift problem.

BRIEF SUMMARY OF INVENTION

A detailed description is given in the following embodiments with reference to the accompanying drawings. An embodiment of a self-emissive display device comprises a substrate having a pixel region for displaying one of the primary colors and an organic electroluminescent multi-layer structure disposed in the pixel region of the substrate. The organic electroluminescent multi-layer structure comprises a first micro-cavity portion and a second micro-cavity portion adjacent thereto. The first micro-cavity portion comprises an organic layer for light-emitting and a first film for determining light wavelength shift of the first micro-cavity portion. The second micro-cavity portion comprises the organic layer for light-emitting and a second film for determining light wavelength shift of the second micro-cavity portion. The first and second films have different optical lengths, such that the first and second micro-cavity portions provide opposite directions of the light wavelength shift.

Another embodiment of a self-emissive display device comprises a substrate having a pixel region for displaying one of primary colors and an organic electroluminescent multi-layer structure disposed in the pixel region of the substrate. The organic electroluminescent multi-layer structure comprises a first micro-cavity portion and a second micro-cavity portion adjacent thereto. The first micro-cavity portion comprises first and second transparent electrodes for determining light wavelength shift of the first micro-cavity portion and an organic layer between the first and second transparent electrodes for light-emitting. The second micro-cavity portion comprises the first and second transparent electrodes for determining light wavelength shift of the second micro-cavity portion and the organic layer between the first and second transparent electrodes for light-emitting. The first transparent electrodes of the first and second micro-cavity portions have different thicknesses and the second transparent electrodes of the first and second micro-cavity portions have different thicknesses, such that the first and second micro-cavity portions provide opposite directions of the light wavelength shift.

Yet another embodiment of a self-emissive display device comprises a substrate having a pixel region for displaying one of the primary colors and an organic electroluminescent multi-layer structure disposed in the pixel region of the substrate. The organic electroluminescent multi-layer structure comprises a first micro-cavity portion and a second micro-cavity portion adjacent thereto. The first micro-cavity portion, comprises an upper transparent electrode and a first film for determining light wavelength shift of the first micro-cavity portion, a lower transparent electrode, and an organic layer between the lower and upper transparent electrodes for light-emitting. The second micro-cavity portion comprises the upper transparent electrode and a second film for determining light wavelength shift of the second micro-cavity portion, the lower transparent electrode, and the organic layer between the lower and upper transparent electrodes for light-emitting. The upper transparent electrodes of the first and second micro-cavity portions have different thicknesses and the first and second films have different optical lengths, such that the first and second micro-cavity portions provide opposite directions of the light wavelength shift.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims. Embodiments of a semiconductor wafer with an assistant dicing structure and a dicing method thereof are described with reference to the accompanying drawings.

Figure 1:
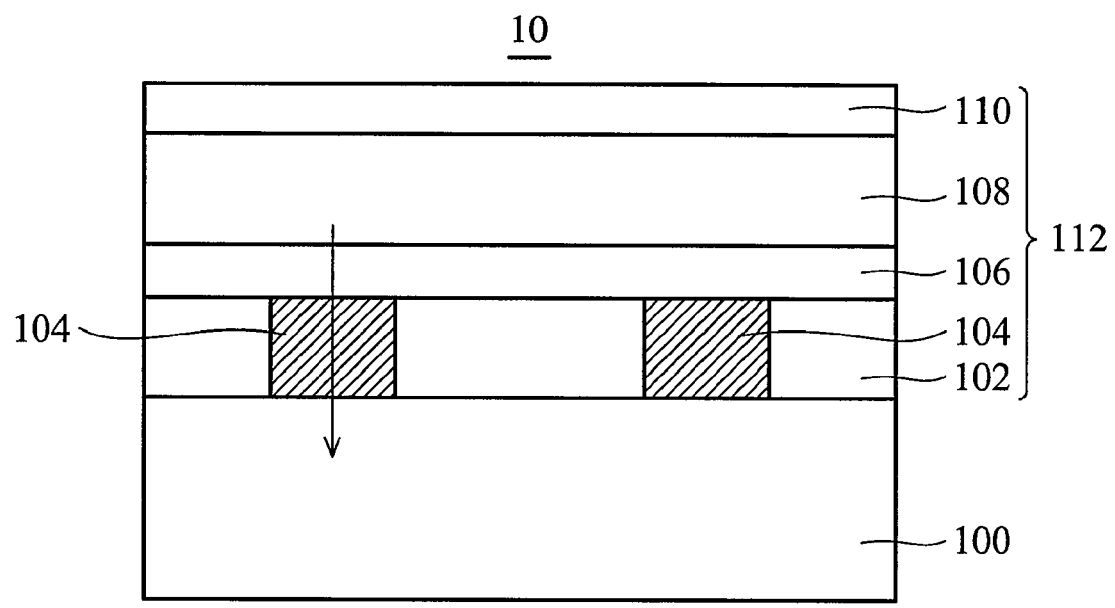
FIG. 1 is a cross section of an embodiment of a bottom-emitting organic light-emitting device.

FIG. 1 is a cross section of an embodiment of a bottom-emitting organic light-emitting device (OLED). The OLED 10 comprises a substrate 100 and an organic electroluminescent multi-layer structure 112. In the embodiment, the substrate 100 may comprise glass, quartz or other transparent material. The substrate 100 has a plurality of pixel regions for displaying three primary colors (i.e. R, G and B). In order to simplify the diagram, only one pixel region 10 for displaying one of the primary colors is depicted. Moreover, one or multiple dielectric layers (not shown) may be formed on the substrate 100 to serve as a buffer layer, an interlayer dielectric (ILD) layer, a planarization layer or a protective layer. The one or multiple dielectric layers may comprise silicon oxide and silicon nitride.

The organic electroluminescent multi-layer structure 112 is disposed in the pixel region 10 of the substrate 100, comprising at least one first micro-cavity portion and at least one second micro-cavity portion. In the embodiment, the first micro-cavity portion comprises a stack of a first film 102, a lower electrode 106, an organic layer 108 and an upper electrode 110. The second micro-cavity portion comprises a stack of a second film 104, the lower electrode 106, the organic layer 108 and the upper electrode 110.

The second film 104 is adjacent to and has substantially the same thickness as the first film 102. The first and second films are employed to determine light wavelength shift of the first and second micro-cavity portions, respectively. In the embodiment, the first film 102 has an optical length different from the second film 104, such that the first and second micro-cavity portions can provide opposite directions of light wavelength shift. In order to make the optical length of the first film 102 different from that of the second film 104, the first and second films 102 and 104 may comprise different dielectric materials. For example, the first film 102 may comprises silicon oxide and the second film 104 may comprise silicon nitride.

For a bottom-emitting OLED, the lower electrode 106 may comprise transparent conductive material, such as indium tin oxide (ITO) and the upper electrode 110 may comprise opaque conductive material, such as aluminum. The organic layer 108 is employed for light-emitting and typically comprises a stack of a hole injection layer (HIL), a hole transport layer (HTL), an emitting material layer (EML), an electron transport layer (ETL) and an electron injection layer (HIL). In order to simplify the diagram, only a single layer is depicted.

When the light emission (as the arrow indicates in FIG. 1) passes through the first and second micro-cavity portions and the underlying substrate 100, the first and second micro-cavity portions can provide opposite directions of light wavelength shift due to the different optical lengths of the first and second films 102 and 104. For example, one of the first and second films 102 and 104 leads to the light wavelength shift toward the long wavelength spectrum (i.e. red-wavelength shift), and the other leads to the light wavelength shift toward the short wavelength spectrum (i.e. blue-wavelength shift). Accordingly, the area ratio between the first and second films 102 and 104 in the pixel region 10 can be varied to mitigate micro-cavity effect from the organic layer 108, thereby balancing color shift in the pixel region 10.

Figure 2:
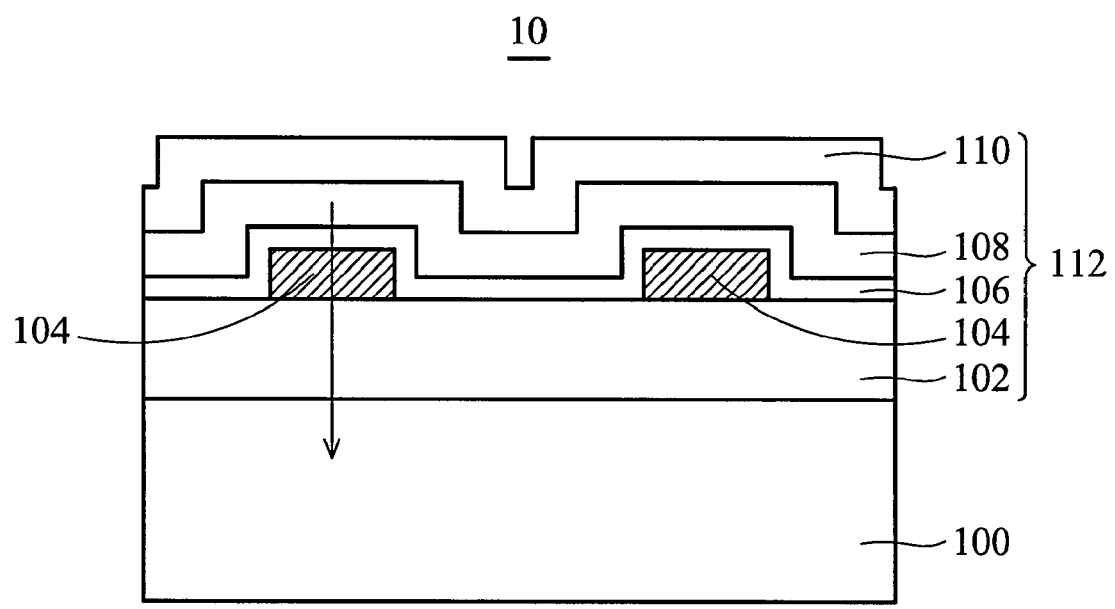
FIG. 2 is a cross section of an embodiment of a bottom-emitting organic light-emitting device.

FIG. 2 is a cross section of an embodiment of a bottom-emitting organic light-emitting device. Elements in FIG. 2 that are the same as those in FIG. 1 are labeled with the same reference numbers as in FIG. 1 and are not described again for brevity. In the embodiment, a first film 102 is adjacent to and laterally extends under a second film 104. That is, a plurality of second films 104 are separated from each other and disposed on the first film 102. In some embodiments, the organic electroluminescent multi-layer structure 112 may comprise only one second film 104, which partially cover the first film 102. Unlike the embodiment shown in FIG. 1, the second micro-cavity portion comprises a stack of a first film 102, a second film 104, a lower electrode 106, an organic layer 108 and an upper electrode 110. The first film 102 may have a thickness the same as or different from the second film 104.

When the light emission (as the arrow indicates in FIG. 2) passes through the first and second micro-cavity portions and the underlying substrate 100, the first and second micro-cavity portions can provide opposite directions of light wavelength shift due to the different optical lengths of the first and second films 102 and 104. Additionally, the light emission successively passes through the second and first films 104 and 102 by passing through the second micro-cavity portion, but only passes through the first film 102 when passing through the first micro-cavity portion. Thus, the first and second micro-cavity portions can provide opposite directions of light wavelength shift even if the first and second films comprise the same dielectric material. Accordingly, the area of the second film 104 in the pixel region 10 can be varied to mitigate micro-cavity effect from the organic layer 108, thereby balancing color shift in the pixel region 10.

Note that the first and second films 102 and 104 can be formed during formation of the buffer layer, the ILD layer, the planarization layer or the protective layer. That is, no additional deposition is required to form the first and second films 102 and 104.

Figure 3:
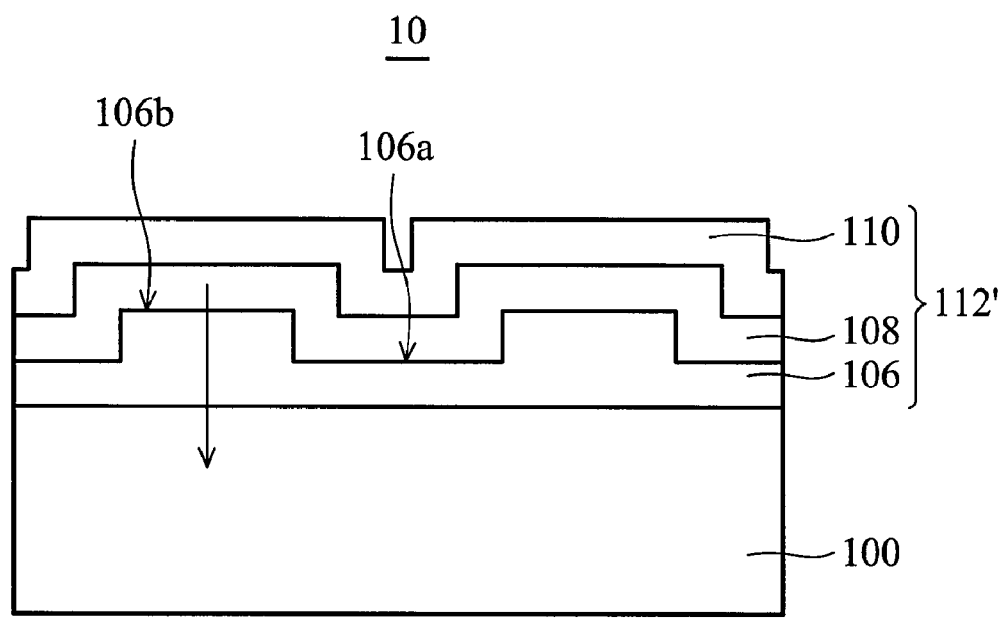
FIG. 3 is a cross section of an embodiment of a bottom-emitting organic light-emitting device.

FIG. 3 is a cross section of an embodiment of a bottom-emitting organic light-emitting device. Elements in FIG. 3 that are the same as those in FIG. 1 are labeled with the same reference numbers as in FIG. 1 and are not described again for brevity. In the embodiment, the first microcavity portion comprises a stack of a first film, an organic layer 108 and an upper electrode 110 and the second micro-cavity portion comprises a stack of a second film, an organic layer 108 and an upper electrode 110. The first film is adjacent to the second film, in which the first film has a thickness different from the second film. Moreover, the first and second films may comprise the same transparent conductive material, such as ITO, and serve as a lower electrode 106 of an organic electroluminescent multi-layer structure 112'. For example, a portion of the lower electrode 106 formed by the first film has a first upper surface 106a and another portion formed by the second film has a second upper surface 106b, in which the first upper surface 106a is lower than the second upper surface 106b.

Since the first and second films have different thicknesses, the lower electrode 106 has two different optical lengths. Thus, when the light emission (as the arrow indicates in FIG. 3) passes through the first and second micro-cavity portions and the underlying substrate 100, the first and second micro-cavity portions can also provide opposite directions of light wavelength shift. Accordingly, the area ratio between the first and second films of the lower electrode 106 in the pixel region 10 can be varied to balance color shift in the pixel region 10.

Figure 4:
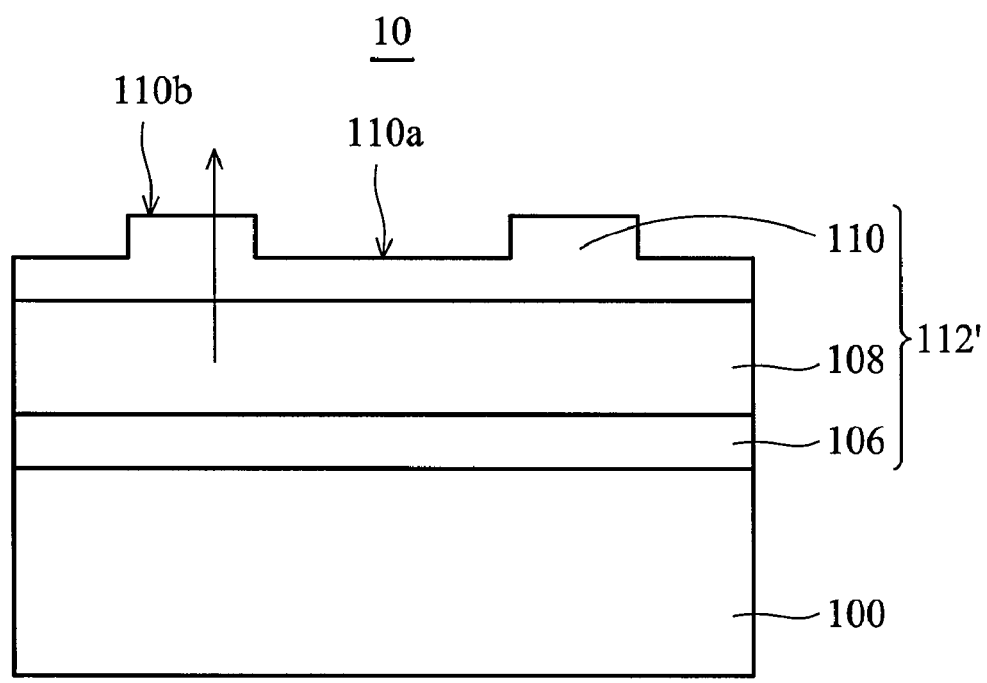
FIG. 4 is a cross section of an embodiment of a top-emitting organic light-emitting device.

In some embodiments, the lower electrode 106 may comprise an opaque conductive material, such as aluminum, and the upper electrode 110 may comprise a transparent material, such as ITO, for a top-emitting OLED. FIG. 4 is a cross section of an embodiment of a top-emitting organic light-emitting device. Elements in FIG. 4 that are the same as those in FIG. 3 are labeled with the same reference numbers as in FIG. 3 and are not described again for brevity. As shown in FIG. 4, the upper electrode 110 may have a structure similar as the lower electrode 106 as shown in FIG. 3. For example, a portion of the upper electrode 110 formed by a first film has a first upper surface 110*a* and another portion formed by a second film has a second upper surface 110*b*, in which the first upper surface 110*a* is lower than the second upper surface 110*b*.

Since the first and second films have different thicknesses, the upper electrode 110 has two different optical lengths. Thus, when the light emission (as the arrow indicates in FIG. 4) passes through the first and second micro-cavity portions and the underlying substrate 100, the first and second micro-cavity portions can also provide opposite directions of light wavelength shift. Accordingly, the area ratio between the first and second films of the upper electrode 110 in the pixel region 10 can be varied to balance color shift in the pixel region 10.

Figure 5:
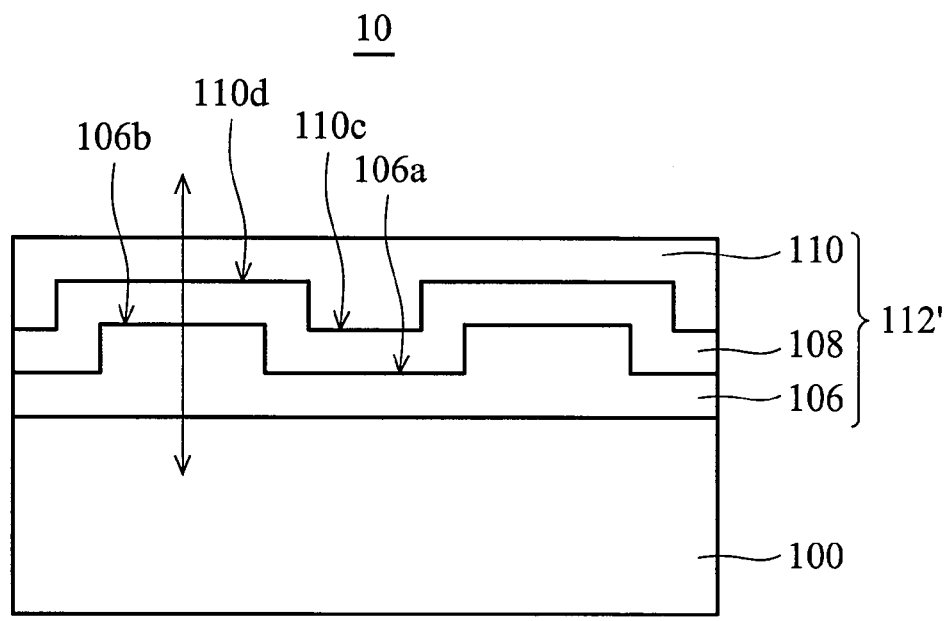
FIG. 5 is a cross section of an embodiment of a double-emitting organic light-emitting device.

FIG. 5 is a cross section of an embodiment of a double-emitting organic light-emitting device. Elements in FIG. 5 that are the same as those in FIGS. 3 and 4 are labeled with the same reference numbers as in FIGS. 3 and 4 and are not described again for brevity. In the embodiment, the first and second micro-cavity portions employ both lower and upper electrodes 106 and 110 formed by transparent conductive materials, such as ITO, to determine the direction of light wavelength shift. The lower electrodes 106 in the first and second micro-cavity portions have different thicknesses and the upper electrodes 110 in the first and second micro-cavity portions also have different thicknesses, such that the first and second micro-cavity portions can provide opposite directions of light wavelength shift. For example, a portion of the lower electrode has a first upper surface 106*a* and another portion has a second upper surface 106*b*, in which the first upper surface 106*a* is lower than the second upper surface 106*b*. Moreover, the upper electrode 110 corresponding to the first upper surface 106*a* of the lower electrode 106 has a first lower surface 110*c* and that corresponding to the second upper surface 106*b* of the lower electrode 106 has a second lower surface 110*d*, in which the first lower surface 110*c* is lower than the second lower surface 110*d*.

As a result, since the upper electrode 110 has two different thicknesses as well as the lower electrode 106, the upper and lower electrodes 110 and 106 have two different optical lengths, respectively. Accordingly, whether or not the light emission is upward or downward (as the arrow indicates in FIG. 5), the first and second micro-cavity portions can provide opposite directions of light wavelength shift, thereby balancing color shift in the pixel region 10.

Figure 6:
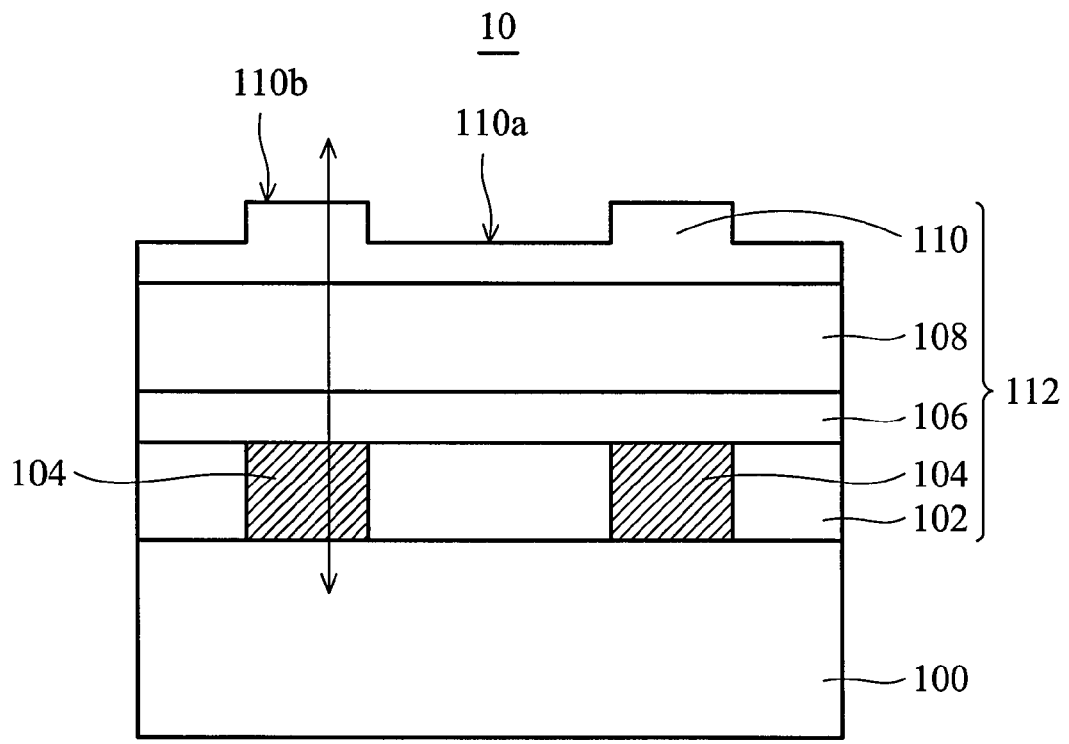
FIG. 6 is a cross section of an embodiment of a double-emitting organic light-emitting device.

FIG. 6 is a cross section of an embodiment of a double-emitting organic light-emitting device. Elements in FIG. 6 that are the same as those in FIGS. 1 and 4 are labeled with the same reference numbers as in FIGS. 1 and 4 and are not described again for brevity. In the embodiment, the first micro-cavity portion employs an upper electrode 110 and a first film 102 to determine the direction of light wavelength shift, and the second micro-cavity portion employs the upper electrode 110 and a second film 104 to determine the direction of light wavelength shift. Upper and lower electrodes 110 and 106 may comprise transparent conductive materials, such as ITO. Moreover, the upper electrode 110 in the first and second micro-cavity portions have different thicknesses. The first film 102 is adjacent to the second film 104, in which the first and second films 102 and 104 have substantially the same thickness. In order to make the first and second micro-cavity portions provide opposite directions of light wavelength shift through different optical lengths of the first and second films 102 and 104, the first and second films 102 and 104 comprise of different dielectric materials. For example, the first film 102 comprises silicon oxide and the second film 104 comprises silicon nitride. Additionally, the upper electrode 110 corresponding to the first film 102 has a first upper surface 110*a* and the upper electrode 110 corresponding to the second film 104 has a second upper surface 110*b*, in which the first upper surface 110*a* is lower than the second upper surface 110*d*.

Figure 7:
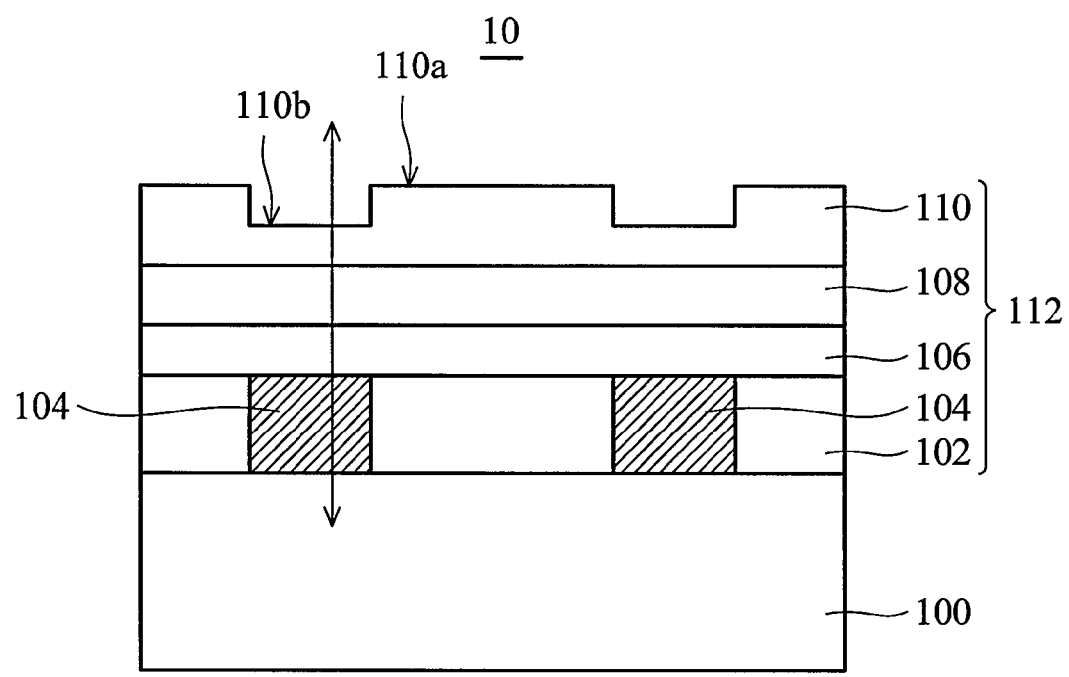
FIG. 7 is a cross section of an embodiment of a double-emitting organic light-emitting device.

In some embodiments, the first upper surface 110*a* is higher than the second upper surface 110*d*, as shown in FIG. 7.

Accordingly, whether or not the light emission is upward or downward (as the arrow indicates in FIG. 6 or 7), the first and second micro-cavity portions can provide opposite directions of light wavelength shift, thereby balancing color shift in the pixel region 10.

Figure 8:
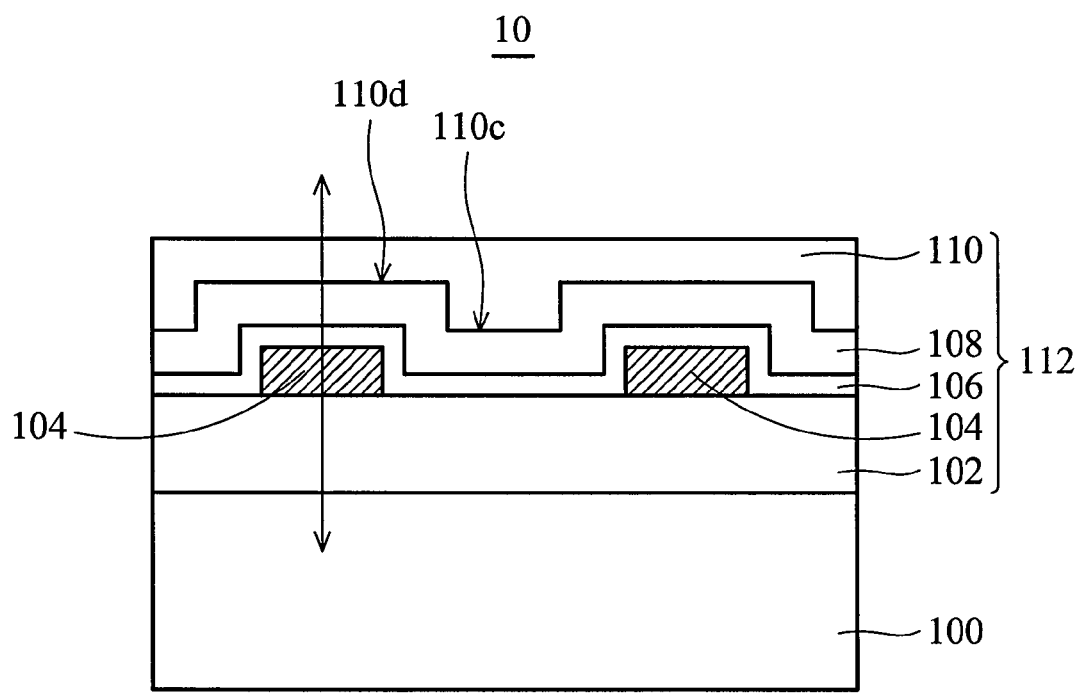
FIG. 8 is a cross section of an embodiment of a double-emitting organic light-emitting device.

FIG. 8 is a cross section of an embodiment of a double-emitting organic light-emitting device. Elements in FIG. 8 that are the same as those in FIGS. 2 and 5 are labeled with the same reference numbers as in FIGS. 2 and 5 and are not described again for brevity. In the embodiment, the first micro-cavity portion employs an upper electrode 110 and a first film 102 to determine the direction of light wavelength shift, and the second micro-cavity portion employs the upper electrode 110 and first and second films 102 and 104 to determine the direction of light wavelength shift. Upper and lower electrodes 110 and 106 may comprise transparent conductive materials, such as ITO. Moreover, the upper electrode 110 in the first and second micro-cavity portions have different thicknesses. The first film 102 is adjacent to and extends under the second film 104, similar as the embodiment shown in FIG. 2. Additionally, the upper electrode 110 corresponding to the first film 102 of the first micro-cavity portion has a first lower surface 110*c* and the upper electrode 110 corresponding to the second film 104 of the second micro-cavity portion has a second lower surface 110*d*, in which the first lower surface 110*c* is lower than the second lower surface 110*d*.

Also, whether or not the light emission is upward or downward (as the arrow indicates in FIG. 8), the first and second micro-cavity portions can provide opposite directions of light wavelength shift, thereby balancing color shift in the pixel region 10.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A self-emissive display device, comprising:
    a substrate having a pixel region to display a single primary color; and
    an organic electroluminescent multi-layer structure disposed in the pixel region of the substrate, comprising:

a first micro-cavity portion, comprising an organic layer for light-emitting and a first film for determining light wavelength shift of the first micro-cavity portion; and a second micro-cavity portion adjacent to the first micro-cavity portion, comprising the organic layer for light-emitting and a second film for determining light wavelength shift of the second micro-cavity portion;

wherein the first and second films have different optical lengths, such that the first and second micro-cavity portions provide opposite directions of the light wavelength shift, and wherein the first film is adjacent to the second film, the first film has a thickness the same as the second film, and the first film comprises a dielectric material different from the second film.

2. The self-emissive display device of claim 1, wherein the first and second films comprise silicon oxide and silicon nitride, respectively.

3. A self-emissive display device, comprising:

a substrate having a pixel region for displaying one of the primary colors; and an organic electroluminescent multi-layer structure disposed in the pixel region of the substrate, comprising:

a first micro-cavity portion, comprising first and second transparent electrodes for determining light wavelength shift of the first micro-cavity portion and an organic layer between the first and second transparent electrodes for light-emitting; and a second micro-cavity portion adjacent to the first micro-cavity portion, comprising the first and second transparent electrodes for determining light wavelength shift of the second micro-cavity portion and the organic layer between the first and second transparent electrodes for light-emitting;

wherein the first transparent electrodes of the first and second micro-cavity portions have different thicknesses and the second transparent electrodes of the first and second micro-cavity portions have different thicknesses, such that the first and second micro-cavity portions provide opposite directions of the light wavelength shift.

4. The self-emissive display device of claim 3, wherein the first or second transparent electrode comprises indium tin oxide.

5. A self-emissive display device, comprising:

a substrate having a pixel region for displaying one of the primary colors; and an organic electroluminescent multi-layer structure disposed in the pixel region of the substrate, comprising:

a first micro-cavity portion, comprising an upper transparent electrode and a first film for determining light wavelength shift of the first micro-cavity portion, a lower transparent electrode, and an organic layer between the lower and upper transparent electrodes for light-emitting; and a second micro-cavity portion adjacent to the first micro-cavity portion, comprising the upper transparent electrode and a second film for determining light wavelength shift of the second micro-cavity portion, the lower transparent electrode, and the organic layer between the lower and upper transparent electrodes for light-emitting;

wherein the upper transparent electrodes of the first and second micro-cavity portions have different thicknesses and the first and second films have different optical lengths, such that the first and second micro-cavity portions provide opposite directions of the light wavelength shift.

6. The self-emissive display device of claim 5, wherein the upper transparent electrode comprises indium tin oxide.

7. The self-emissive display device of claim 5, wherein the first film is adjacent to the second film, having the same thickness as and different dielectric material from the second film.

8. The self-emissive display device of claim 7, wherein the first and second films comprise silicon oxide and silicon nitride, respectively.

9. The self-emissive display device of claim 5, wherein the first film laterally extends under the second film.

10. The self-emissive display device of claim 9, wherein the first and second films comprise silicon oxide and silicon nitride, respectively.

\* \* \* \* \*